US008384384B2

(12) United States Patent
Zhao et al.

(10) Patent No.: US 8,384,384 B2
(45) Date of Patent: Feb. 26, 2013

(54) SYSTEM AND METHOD FOR SPLIT-ECHO SPLIT-BLADE DATA COLLECTION FOR PROPELLER MAGNETIC RESONANCE IMAGING

(75) Inventors: Xiaoli Zhao, New Berlin, WI (US); Zhiqiang Li, Tempe, AZ (US); Ajeetkumar Gaddipati, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 413 days.

(21) Appl. No.: 12/752,261

(22) Filed: Apr. 1, 2010

(65) Prior Publication Data

US 2011/0241671 A1 Oct. 6, 2011

(51) Int. Cl.
*G01V 3/00* (2006.01)
(52) U.S. Cl. ...................................................... 324/309
(58) Field of Classification Search ........... 324/300–322
See application file for complete search history.

(56) References Cited

U.S. PATENT DOCUMENTS

| 6,882,148 | B2 | 4/2005 | Pipe |
| 7,030,609 | B2 | 4/2006 | Pipe |
| 7,538,548 | B2 | 5/2009 | Avram et al. |
| 8,154,293 | B2 * | 4/2012 | Li et al. ........................ 324/318 |
| 2010/0188085 | A1 * | 7/2010 | Huo et al. ..................... 324/309 |

OTHER PUBLICATIONS

Schick, "SPLICE: Sub-Second Diffusion Sensitive MR Imaging Using a Modified Fast Spin Echo Acquisition Mode," Magnetic Resonance in Medicine, 1997, vol. 38, pp. 638-644.
Pipe, "Motion Correction With Propeller MRI: Application to Head Motion and Free Breathing Cardiac Imaging," Magnetic Resonance in Medicine, 1999, vol. 42, pp. 963-969.
Pipe et al., "Multishot Diffusion-Weighted FSE Using PROPELLAR MRI," Magnetic Resonance in Medicine, 2002, vol. 47, pp. 42-52.
Deng et al., "Multishot Diffusion-Weighted SPLICE PROPELLAR MRI of the Abdomen," Magnetic Resonnance in Medicine, 2008, vol. 59, pp. 947-953.
Murdoch, "An "Effective" Method for Generating Spin-Echo Intensity Expressions," Proceedings of the 2nd Annual Scientific Meeting, SMR, San Francisco, 1994.
Le Roux, "Non-CPMG Fast Spin Echo with Full Signal," Journal of Magnetic Resonance, 2002, vol. 155, pp. 278-292.
Hennig et al., "Measurement of CSF Flow Using an Interferrographic MR Technique Based on the Rare-Fast Imaging Sequence," Magnetic Resonance Imaging, 1990, vol. 8, pp. 543-556.

* cited by examiner

*Primary Examiner* — Dixomara Vargas
(74) *Attorney, Agent, or Firm* — Ziolkowski Patent Solutions Group, SC

(57) ABSTRACT

A computer readable storage medium has stored thereon a computer program having instructions, which, when executed by a computer, cause the computer to apply a first plurality of RF pulses during a first TR interval of an MR pulse sequence to generate a first echo train. A plurality of echoes of the first echo train are split into a plurality of echo pairs. Within a first echo space, first and second gradient pulses are applied during respective first and second generated echoes, and respective first and second sets of k-space data are acquired that correspond to respective first and second blades of k-space data in the same k-space. The first and second blades have orientations at different angles from one another. The instructions further cause the computer to reconstruct an image based on the acquired first and second sets of k-space data.

20 Claims, 3 Drawing Sheets

SYSTEM AND METHOD FOR SPLIT-ECHO SPLIT-BLADE DATA COLLECTION FOR PROPELLER MAGNETIC RESONANCE IMAGING

BACKGROUND OF THE INVENTION

Embodiments of the invention relate generally to Fast Spin Echo (FSE) magnetic resonance (MR) imaging and, more particularly, to a system and method of split-echo, split-blade data collection for PROPELLER MR imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net "transverse magnetization" $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

FSE imaging is an imaging technique commonly used as an efficient method of collecting MR data with minimal artifact. A FSE pulse sequence uses multiple refocusing RF pulses to generate an echo train after a single excitation RF pulse. Generally, FSE requires that the phase of all the refocusing RF pulses be substantially identical to that of the initial transverse magnetization after excitation, commonly referred to as the Carr-Purcell-Meiboom-Gill (CPMG) condition. If this condition is not met, the resulting MR signal is generally affected by destructive echo interference, resulting in unstable echo train and signal cancellation. Specifically, the signals of FSE echo train are from the contributions of a large number of so-called pathways. Under CPMG condition, the signals from different pathways reinforce one another thus the signal intensities of the later echoes are stably maintained. If the CPMG condition is violated, these signals from different pathways no longer line up and destructive interference occurs. Accordingly, the resulting signals will decay rapidly in successive echoes.

As a result, FSE imaging with diffusion weighted imaging (DWI) may be difficult, in general, since even minute patient motion or system vibration during application of diffusion weighting gradients leaves the spins with a spatially varying and unknown starting phase prior to refocusing RF pulse train. A number of imaging techniques have been developed that modulates the phase of the refocusing pulses to attempt to delay the echo signal decay. However, these known techniques have been shown to prolong the signal magnitude, but, in general, cause a spatially varying phase which alternates between even and odd echoes, which makes combining the two sets of echoes difficult.

FSE imaging has been implemented with PROPELLER (Periodically Rotated Overlapping Parallel Lines with Enhanced Reconstruction) technique to address the phase discrepancy among echo trains. PROPELLER encodes MR signals by collecting data during an echo train such that a rectangular strip, or "blade", through the center of k-space is measured. This strip is incrementally rotated in k-space about the origin in subsequent echo trains, thereby the phase inconsistency among blades can be corrected by using the overlapped data at central k-space. PROPELLER can mitigate the violation of CPMG condition by RF phase modulation combined with split-blade acquisition. However, for this type of techniques, the flip angle of refocusing RF pulses is preferred to be high enough to stabilize the echo train, which results in long scanning time at high field strength due to the limit of specific absorption rate (SAR). Also, the number of the acquired lines of each blade is just half of the echo train length, which is not desirable for PROPELLER reconstruction that requires wide blade width to avoid potential artifacts.

SPLICE PROPELLER is another imaging approach that can mitigate non-CPMG artifacts. SPLICE uses an imbalanced readout gradient and an extended acquisition window to split each echo in an echo train into an echo pair. Two k-space datasets have to be acquired simultaneously, and two intermediate PROPELLER images have to be reconstructed by separately using the first and second echoes in each echo pair. As such, SPLICE PROPELLER has the disadvantage of decreased data acquisition efficiency, due to the requirement of simultaneous acquisition of two k-space datasets.

It would therefore be desirable to have a system and method capable of acquiring split-echo split-blade data while mitigating non-CPMG artifacts. Specifically, it would be desirable to provide a FSE method that generate echo pairs to create two blades for each echo train, without the reduction of blade width to avoid the potential narrow-blade artifacts. Also, it would be desirable to place the two split blades into a single k-space such that the data acquisition efficiency is not sacrificed.

BRIEF DESCRIPTION OF THE INVENTION

In accordance with one aspect of the invention, a computer readable storage medium having stored thereon a computer program having instructions, which, when executed by a computer, cause the computer to apply a first plurality of radio frequency (RF) pulses during a first repetition time (TR) interval of a magnetic resonance (MR) pulse sequence to generate a first echo train and split a plurality of echoes of the first echo train into a plurality of echo pairs. Within a first echo space bounded by an adjacent pair of RF pulses of the first plurality of RF pulses, the instructions cause the computer to apply a first gradient pulse during a first generated echo of a first echo pair and acquire a first set of k-space data from the first generated echo of the first echo pair and during the application of the first gradient pulse, wherein the first set of k-space data corresponds to a first blade of k-space data. Within the first echo space, the instructions also cause the computer to apply a second gradient pulse after acquisition of the first set of k-space data and during a second generated echo of the first echo pair, and acquire a second set of k-space data from the second generated echo of the first echo pair and during the application of the second gradient pulse, wherein the second set of k-space data corresponds to a second blade of k-space data in a same k-space as the first set of k-space data, and wherein the second blade has a blade orientation at a different angle than a blade orientation of the first blade. The instructions also cause the computer to reconstruct an image based on the acquired first and second sets of k-space data.

According to another aspect of the invention, a method includes generating an echo train via application of a radio frequency (RF) pulse train during each repetition time (TR)

interval of a pulse sequence and splitting echoes of the echo train into multiple echo pairs, each echo pair including a first echo followed by a second echo and occurring during a respective echo space of the RF pulse train. For each respective echo space, the method includes applying a plurality of gradient pulses toward an imaging object and acquiring magnetic resonance (MR) data for a first k-space blade from the first echo during application of a first pulse of the plurality of gradient pulses and during the first echo of the echo pair corresponding to the respective echo space. Also, for each respective echo space, the method includes acquiring MR data for a second k-space blade from the second echo during application of a second pulse of the plurality of gradient pulses and during the second echo of the echo pair corresponding to the respective echo space, wherein the first and second blades are non-parallel and correspond to a single k-space. The method further includes reconstructing the acquired MR data into an image and displaying the image to a user.

According to yet another aspect of the invention, an MRI apparatus includes a magnetic resonance imaging (MRI) system having a plurality of gradient coils positioned about a bore of a magnet to impress a polarizing magnetic field and an radio frequency (RF) transceiver system and an RF switch controlled by a pulse module to transmit RF signals to an RF coil assembly to acquire MR images. The MRI apparatus also includes a computer programmed to apply pulses of a pulse sequence toward an imaging object, wherein the pulse sequence includes a plurality of echo spaces. The pulses include a plurality of RF pulses corresponding to the plurality of echo spaces, a plurality of phaser gradient pulses corresponding to each echo space of the plurality of echo spaces, and a plurality of readout gradient pulses corresponding to each echo space of the plurality of echo spaces. The plurality of phaser gradient pulses are configured cause a pair of echoes to be generated during each echo space, wherein each pair of echoes includes a first echo followed by a second echo. The computer is also programmed to acquire k-space data for a first k-space blade during application of a first readout gradient pulse of the plurality of readout gradient pulses in a first echo space and during the first echo of the first echo space and to acquire k-space data for a second k-space blade during application of a second readout gradient pulse of the plurality of readout gradient pulses in the first echo space and during the second echo of the first echo space, wherein the second k-space blade is orthogonal to the first k-space blade, and wherein the first and second k-space blades correspond to a single k-space. The computer is programmed to reconstruct acquired k-space data for the first and second k-space blades into an image.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
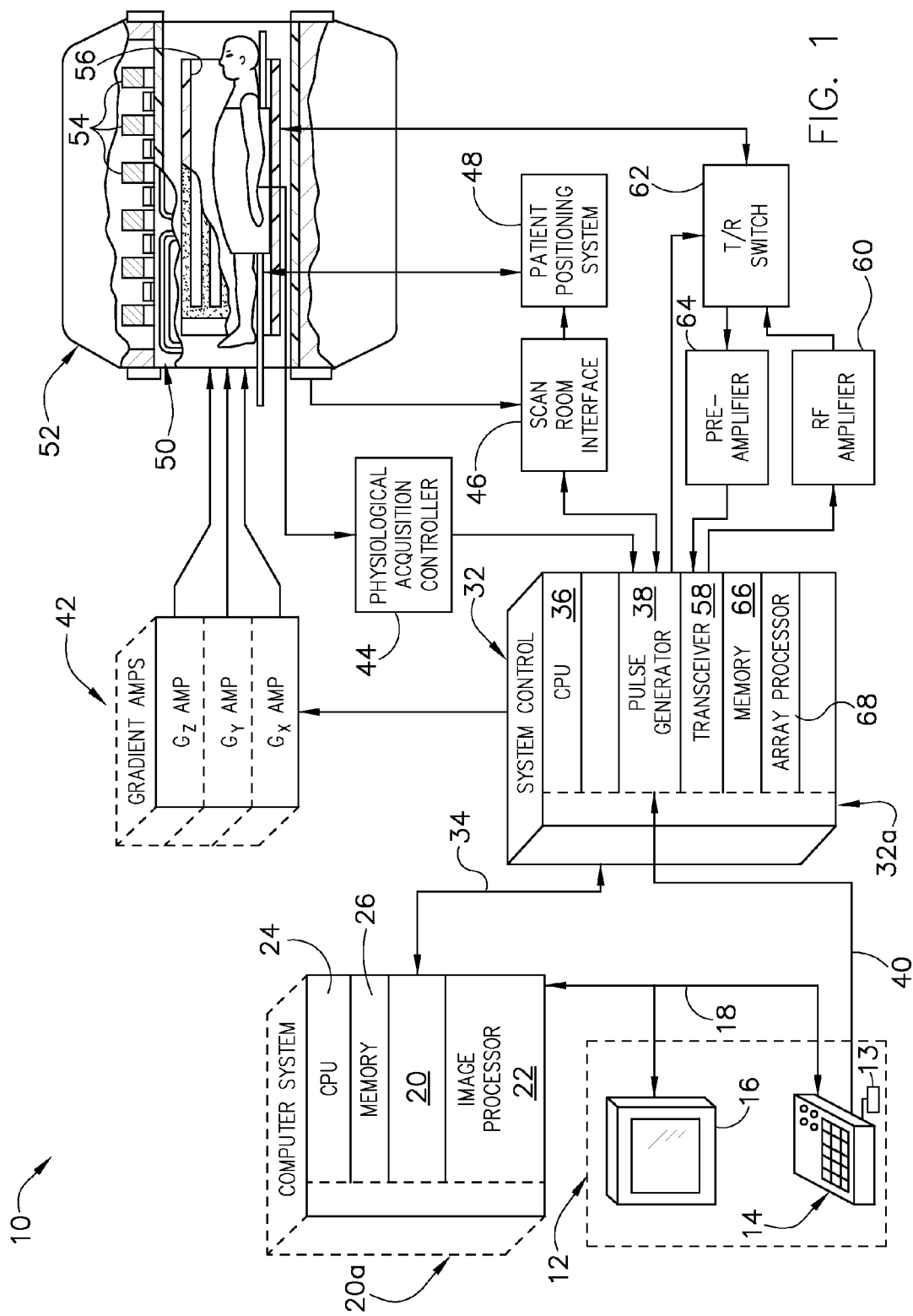
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the radio frequency (RF) pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
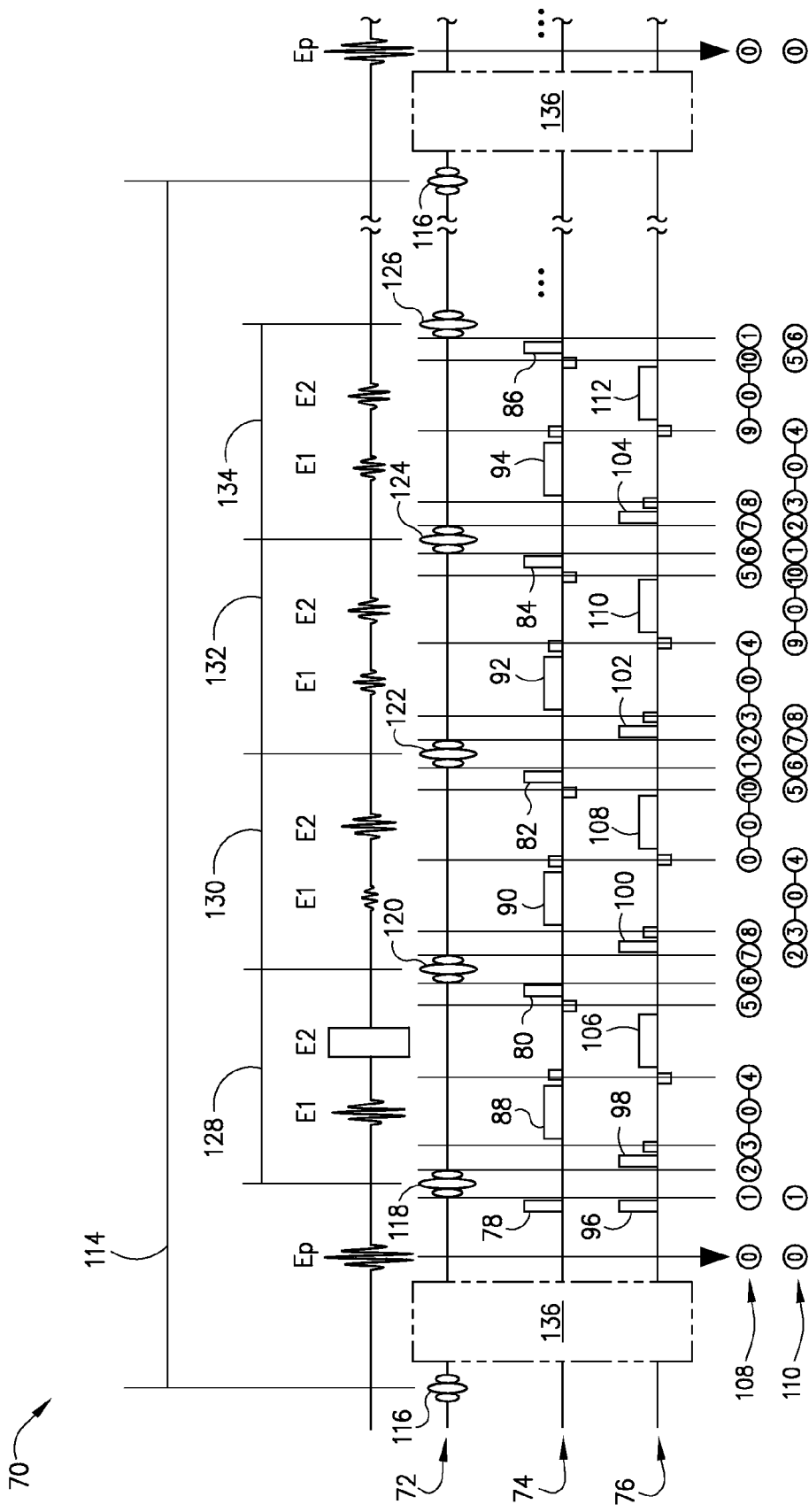
FIG. 2 is a pulse sequence diagram of a split-echo, split-blade pulse sequence according to an embodiment of the invention.

Referring now to FIG. 2, a portion of a split-echo, split-blade pulse sequence 70 is illustrated according to an embodiment of the invention. It should be noted that slice encoding gradients, gradient crushers, and some balancing gradients are not shown to simplify that illustrated in FIG. 2. However, it is contemplated that sequence 70 includes such gradient pulses. As shown, pulse sequence 70 includes an RF pulse train 72, a first gradient pulse train 74, and a second gradient pulse train 76. The direction of each gradient pulse in first gradient pulse train 74 is perpendicular to the direction of each gradient pulse in second gradient pulse train 76. In one embodiment, first gradient pulse train 74 corresponds to gradient pulses to be applied along the Gx axis, and second gradient pulse train 76 corresponds to gradient pulses to be applied along the Gy axis. The first gradient pulse train 74 includes a plurality of phaser gradients 78-86 and a plurality of readout gradients 88-94. The second pulse train 76 also includes a plurality of phaser gradients 96-104 and a plurality of readout gradients 106-112. In one embodiment, the area of the phaser gradients 78-86, 96-104 is one half of the area of the readout gradients 88-94, 106-112.

Pulse sequence 70 is constructed such that an echo train resulting, in part, from RF pulse train 72 is generated during each repetition interval (TR) 114. Each TR 114 of pulse sequence 70 includes an excitation RF pulse 116 followed by a plurality of subsequent refocusing RF pulses 118-126. In one embodiment, RF pulse 116 has a flip angle of 90 degrees, and RF pulses 118-126 have flip angle of, for example, 110 degrees. However, it is contemplated that RF pulses 116 and 118-126 may have flip angles other than 90 degrees and 110 degrees, respectively. The length of TR 114 corresponds to the length between RF pulses 116, and RF pulse train 72 includes a number of echo spaces 128-134 and so on corresponding to the spaces between the RF pulses 118-126 thereof.

Pulse sequence 70 is designed to split the echo in an echo train into echo pairs E1 and E2, which will be further discussed later. As such, pulse sequence 70 is insensitive to the violation of the CPMG condition. In one embodiment, a pulse sequence 136 configured according to a DWI imaging preparation scheme may be implemented. However, other spin preparations resulting in a non-CPMG condition is also contemplated herein. Further, embodiments of the invention may include positioning an imaging object within a bore of the MR system magnet (such as magnet 54 of MRI system 10 shown in FIG. 1) so as to cause a violation of the CPMG conditions due to, for example, the eddy current, field inhomogeneity, and susceptibility. The imaging object positioning may be carried out instead of or in addition to implementation of pulse sequence 136.

Following the application of excitation RF pulse 116 and spin preparation 136 in repetition interval 114, an initial echo signal Ep is prepared. An echo train is generated under the application of refocusing RF pulse train 118-126. Specifically, the signals of FSE echo train are from the contributions of a large number of so-called pathways. Each pathway may contribute signal to one or more echoes in the echo train. To appreciate how an echo in each echo space 128-134 is split into echo pair E1 and E2, and furthermore, to appreciate how the first echoes E1 and the second echoes E2 are split to two perpendicular blades in a single k-space, two out of the large number of pathways will be used for illustration purposes only. One skilled in the art will recognize that many more pathways will exist.

Figure 3:
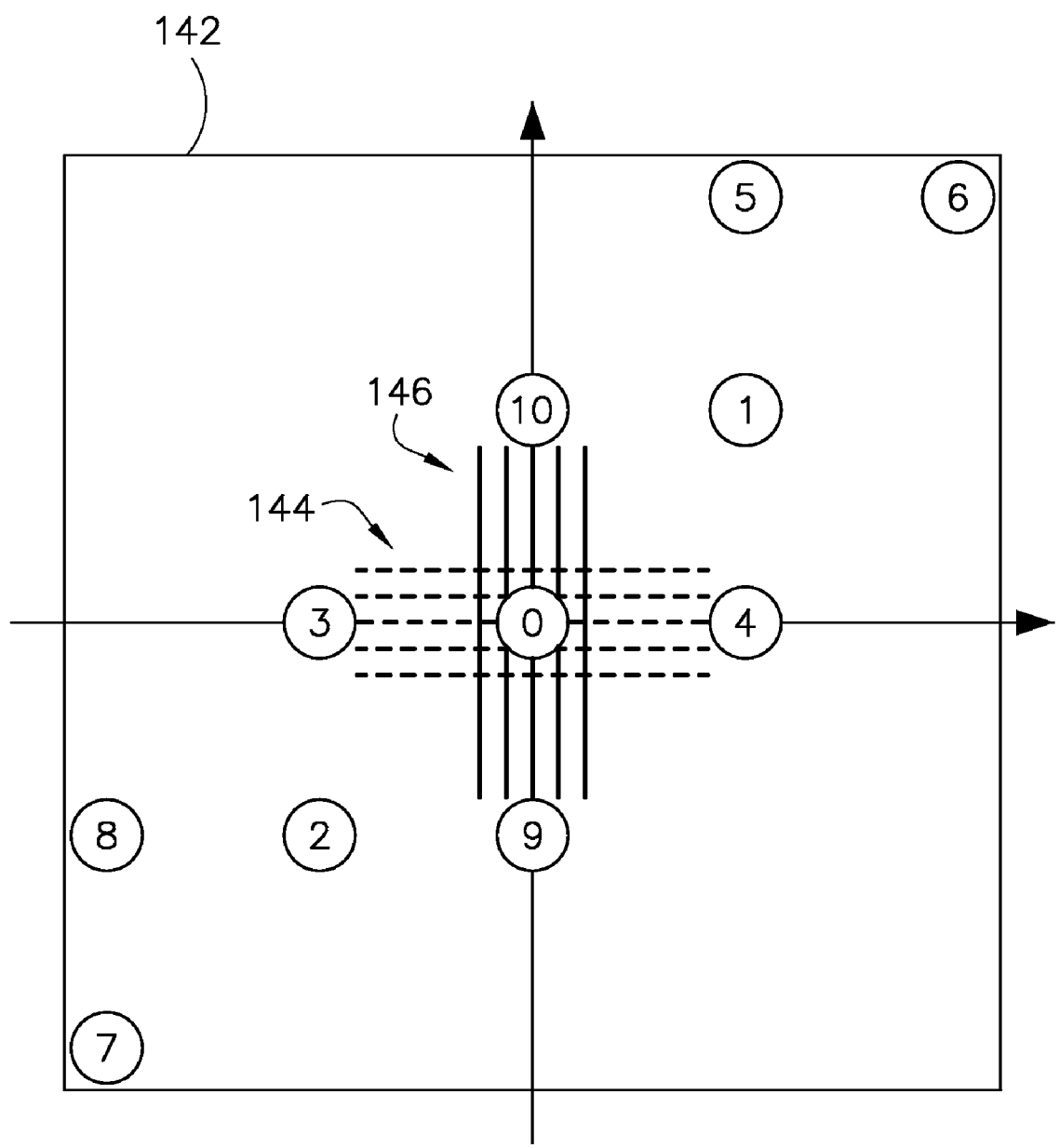
FIG. 3 is a diagram showing a k-space and an acquisition order of k-space data according to an embodiment of the invention.

The first exemplary pathway 138 as shown in FIG. 2 is the pure spin echo pathway starting from the initial echo Ep. The second exemplary pathway 140 includes the initial echo Ep, the first stimulate echo (E1 in second echo space 130) and the following spin echoes originated from the first stimulate echo. The first stimulate echo is generated by the application of RF pulses 118 and 120; all the spin echoes are generated by their preceding RF pulses 118-126. The time-ordered circles with numbers zero to ten mark the pathway's k-space position as shown in FIG. 3. The eleven positions will be described in text as positions P0 through P10. The location of positions P0 through P10 in k-space 142 are merely exemplary, and other locations are also considered to be within the scope of embodiments of the invention.

Referring to first pathway 138 in FIG. 2 together with FIG. 3, the initial echo Ep may be associated with position P0 since gradients 78-112 have not yet been applied. To move to position P1, phaser gradients 78, 96 are applied. After application of RF pulse 118, the pathway's active k-space position is flipped around the k-space origin to the opposite position P2. The successive application of phaser gradient 98 in echo space 128 moves the active position to P3. During readout gradient 88 application, a portion of data (such as one line of k-space data) for the first blade 144 is acquired. Following application of readout gradient 106 and phaser gradient 80, positions P5 and P6 are respectively traversed. After application of RF pulse 120, the active position is flipped around the k-space origin to the opposite position P7. During echo space 130, positions P8 through P9 are traversed via application of phaser gradient 100 and readout gradient 90. During readout gradient 108, positions P0 and P10 are traversed, and a portion of data (such as one line of k-space data) for the second blade 146 is acquired. Following the application of phaser gradient 82, position P1 is again reached. Each pair of subsequent echo spaces (such as echo spaces 132, 134) traverse positions P1 through P10 as described with respect to echo spaces 128, 130. As such, pathway 138 contributes signals to the first echoes E1 in the odd echo spaces 128, 132 and those that follow. Also, pathway 138 contributes signals to the second echoes E2 in the even echo spaces 130, 134 and those that follow.

Referring now to second pathway 140, the first stimulate echo is generated and positioned at position P2 after application of phaser gradients 78, 96 and RF pulses 118, 120. Positions P3 and P4 are traversed via application of pulses 100, 90. During readout gradient 90, another portion of first blade 144 is acquired. Positions P5-P10 are traversed via application of pulses 108, 82, 122, 102, 92, and 110. During readout gradient 110, another portion of second blade 146 is acquired. After application of phaser gradient 84, position P1 is reached. Each pair of subsequent echo spaces (such as echo space 134 and the echo space that follow) traverse positions P1 through P10 as described with respect to echo spaces 130, 132. As such, pathway 140 contributes signals to the first echoes E1 in the even echo spaces 130, 134 and those that follow. Also, pathway 140 contributes signals to the second echoes E2 in the odd echo paces 132 and those that follow.

As explained above, it is appreciated that the data for first k-space blade 144 may be acquired during a first gradient pulse 88-94 recurring in each echo space, and the data for second k-space blade 146 may be acquired during a second gradient pulse 106-112 recurring in each echo space. It is noteworthy that the data acquired for the first k-space blade 144 are all from the first echoes E1 of each echo pair, and the data acquired for the second k-space blade 146 are all from the second echoes E2 of each echo pair. As illustrated in FIGS. 2 and 3, first k-space blade 144 represents a horizontal blade in repetition interval 114, and second k-space blade 146 represents a vertical blade in repetition interval 114. Repetition interval 114 thus allows the acquisition of full first and second k-space blades 144, 146. During subsequent repetition intervals, the Gx and Gy gradients are rotated via a rotation matrix as understood in the art such that first and second orthogonal blades for different rotation angles may be acquired according to embodiments of the invention. In this manner, a single set of k-space data may be acquired for the multiple blades for PROPELLER reconstruction into an image. The image may be stored or displayed to a user.

It is reiterated that, the signal of each of the first echoes E1 and second echoes E2 in echo pair train, is the add-up from the contributions of a large number of pathways. Each pathway has unique contributions to one or more echoes, with the limitation that it cannot simultaneously contribute to both the first echo E1 and the second echo E2 in the same echo space. For example, pathway 138 contributes signals to the first echoes E1 in the odd echo spaces 128, 132 and those that follow. Also, pathway 138 contributes signals to the second echoes E2 in the even echo paces 130, 134 and those that follow. For another example, pathway 140 contributes signals to the first echoes E1 in the even echo spaces 130, 134 and those that follow. Also, pathway 140 contributes signals to the second echoes E2 in the odd echo paces 132 and those that follow. It is noted that pathway 138 and pathway 140 are merely exemplary, and other pathways are also considered to be within the scope of embodiments of the invention. It is appreciated that, all the contributions to each echo E1, from a large number of pathways, have a consistent phase; thus, their signals build up without destructive interference. Also, all the contributions to each echo E2, from another large number of pathways, have a consistent phase; thus, their signals build up without destructive interference as well. It is further appreciated that, all the first echoes E1 in an echo pair train have a consistent phase and all the second echoes E2 in an echo pair train have another consistent phase. It is even further appreciated that phase inconsistency exists between the first echoes E1 and the second echoes E2. Because the E1 echoes are used to create the first blade 144 and E2 echoes are separately used to create the second blade 146, the phase inconsistency between E1 echoes and E2 echoes can be corrected by the PROPELLER reconstruction as described in the art. As such, the signal destruction caused by CPMG condition violation is avoided.

Preferably, the E1 and E2 echoes in the first several echo spaces, such as the E1 and E2 echoes in echo spaces 128 and 130, may not be acquired for the purpose of build-up of steady state. However, it is contemplated that acquisition of data during the first several echo spaces is also included in the scope of the embodiments of the invention.

It is thus appreciated that with embodiments of the invention, each echo in the echo train is split into echo pair E1 and E2 by the synchronized application of phaser gradients 78-86, readout gradients 88-94, phaser gradients 96-104, and readout gradients 106-112. There exists one echo pair E1 and E2 in each of the echo spaces 128-134; thus, the total number of echoes (number of E1 plus number of E2) is twice the echo train length. The synchronized application of the phaser gradients and readout gradients is a notable aspect of the embodiments of the invention, as it not only splits the echoes, but also generates data for two perpendicular blades within the same k-space.

With respect to FIG. 1, one skilled in the art will appreciate that MRI system 10 of FIG. 1 includes a plurality of components such as one or more of electronic components, hardware components, and/or computer software components. These components may include one or more computer readable storage media that generally stores instructions such as software, firmware and/or assembly language for performing one or more portions of one or more implementations or embodiments of sequence 70. These computer readable storage media are generally non-transitory and/or tangible. Examples of such a computer readable storage medium include a recordable data storage medium of the computer 20 and/or storage device 28. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of the system 10. Further, such components may include a set and/or series of computer instructions written in or implemented with any of a number of programming languages, as will be appreciated by those skilled in the art.

In addition, other forms of computer readable media such as a carrier wave may be employed to embody a computer data signal representing a sequence of instructions that when executed by one or more computers causes the one or more computers to perform one or more portions of one or more implementations or embodiments of sequence 70.

A technical contribution for the disclosed method and apparatus is that is provides for a computer implemented system and method of multi-echo, split-blade data collection for MR imaging.

Therefore, in accordance with one embodiment of the invention, a computer readable storage medium having stored thereon a computer program having instructions, which, when executed by a computer, cause the computer to apply a first plurality of radio frequency (RF) pulses during a first repetition time (TR) interval of a magnetic resonance (MR) pulse sequence to generate a first echo train and split a plurality of echoes of the first echo train into a plurality of echo pairs. Within a first echo space bounded by an adjacent pair of RF pulses of the first plurality of RF pulses, the instructions cause the computer to apply a first gradient pulse during a first generated echo of a first echo pair and acquire a first set of k-space data from the first generated echo of the first echo pair and during the application of the first gradient pulse, wherein the first set of k-space data corresponds to a first blade of k-space data. Within the first echo space, the instructions also cause the computer to apply a second gradient pulse after acquisition of the first set of k-space data and during a second generated echo of the first echo pair, and acquire a second set of k-space data from the second generated echo of the first echo pair and during the application of the second gradient pulse, wherein the second set of k-space data corresponds to a second blade of k-space data in a same k-space as the first set of k-space data, and wherein the second blade has a blade orientation at a different angle than a blade orientation of the first blade. The instructions also cause the computer to reconstruct an image based on the acquired first and second sets of k-space data.

According to another embodiment of the invention, a method includes generating an echo train via application of a radio frequency (RF) pulse train during each repetition time (TR) interval of a pulse sequence and splitting echoes of the echo train into multiple echo pairs, each echo pair including a first echo followed by a second echo and occurring during a respective echo space of the RF pulse train. For each respective echo space, the method includes applying a plurality of gradient pulses toward an imaging object and acquiring magnetic resonance (MR) data for a first k-space blade from the first echo during application of a first pulse of the plurality of gradient pulses and during the first echo of the echo pair corresponding to the respective echo space. Also, for each respective echo space, the method includes acquiring MR data for a second k-space blade from the second echo during application of a second pulse of the plurality of gradient pulses and during the second echo of the echo pair corresponding to the respective echo space, wherein the first and second blades are non-parallel and correspond to a single k-space. The method further includes reconstructing the acquired MR data into an image and displaying the image to a user.

According to yet another embodiment of the invention, an MRI apparatus includes a magnetic resonance imaging (MRI) system having a plurality of gradient coils positioned about a bore of a magnet to impress a polarizing magnetic field and an radio frequency (RF) transceiver system and an RF switch controlled by a pulse module to transmit RF signals to an RF coil assembly to acquire MR images. The MRI apparatus also includes a computer programmed to apply pulses of a pulse sequence toward an imaging object, wherein the pulse sequence includes a plurality of echo spaces. The pulses include a plurality of RF pulses corresponding to the plurality of echo spaces, a plurality of phaser gradient pulses corresponding to each echo space of the plurality of echo spaces, and a plurality of readout gradient pulses corresponding to each echo space of the plurality of echo spaces. The plurality of phaser gradient pulses are configured cause a pair of echoes to be generated during each echo space, wherein each pair of echoes includes a first echo followed by a second echo. The computer is also programmed to acquire k-space data for a first k-space blade during application of a first readout gradient pulse of the plurality of readout gradient pulses in a first echo space and during the first echo of the first echo space and to acquire k-space data for a second k-space blade during application of a second readout gradient pulse of the plurality of readout gradient pulses in the first echo space and during the second echo of the first echo space, wherein the second k-space blade is orthogonal to the first k-space blade, and wherein the first and second k-space blades correspond to a single k-space. The computer is programmed to reconstruct acquired k-space data for the first and second k-space blades into an image.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer readable storage medium having stored thereon a computer program comprising instructions, which, when executed by a computer, cause the computer to:
   apply a first plurality of radio frequency (RF) pulses during a first repetition time (TR) interval of a magnetic resonance (MR) pulse sequence to generate a first echo train;
   split a plurality of echoes of the first echo train into a plurality of echo pairs;
   within a first echo space bounded by an adjacent pair of RF pulses of the first plurality of RF pulses:
      apply a first gradient pulse during a first generated echo of a first echo pair;
      acquire a first set of k-space data from the first generated echo of the first echo pair and during the application of the first gradient pulse, wherein the first set of k-space data corresponds to a first blade of k-space data;
      apply a second gradient pulse after acquisition of the first set of k-space data and during a second generated echo of the first echo pair; and
      acquire a second set of k-space data from the second generated echo of the first echo pair and during the application of the second gradient pulse, wherein the second set of k-space data corresponds to a second blade of k-space data in a same k-space as the first set of k-space data, and wherein the second blade has a blade orientation at a different angle than a blade orientation of the first blade; and
   reconstruct an image based on the acquired first and second sets of k-space data.

2. The computer readable storage medium of claim 1 wherein the instructions that cause the computer to acquire reconstruct the image cause the computer to reconstruct the image using PROPELLER reconstruction.

3. The computer readable storage medium of claim 1 wherein the instructions further cause the computer to repeat the application of the first and second gradient pulses and the acquisition of the first and second sets of k-space data within additional echo spaces to acquire full first and second blades of k-space data.

4. The computer readable storage medium of claim 3 wherein the instructions further cause the computer to:
   apply a rotation matrix prior to a second TR interval of the MR pulse sequence, the rotation matrix configured to rotate acquisition of k-space data;
   apply a second plurality of RF pulses during the second TR interval to generate a second echo train;
   split echoes of the second echo train into echo pairs;
   within respective echo spaces bounded by adjacent pairs of RF pulses of the second plurality of RF pulses:
      apply a first gradient pulse during a first generated echo of a respective echo pair;
      acquire a third set of k-space data from the first generated echo of the respective echo pair and during the application of the first gradient pulse, wherein the third set of k-space data corresponds to a third blade of k-space data in the same k-space as the first and second sets of k-space data, and wherein the third blade has a blade orientation at a different angle than the first and second blades;
apply a second gradient pulse after acquisition of the third set of k-space data and during a second generated echo of the respective echo pair; and
acquire a fourth set of k-space data from the second generated echo of the respective echo pair and during the application of the second gradient pulse, wherein the fourth set of k-space data corresponds to a fourth blade of k-space data in the same k-space as the third set of k-space data, and wherein the fourth blade has a blade orientation at a different angle than the first, second, and third blades; and
wherein the instructions that cause the computer to reconstruct the image cause the computer to reconstruct the image based on the acquired first, second, third, and fourth sets of k-space data.

5. The computer readable storage medium of claim 3 wherein the instructions further cause the computer to:
apply a first plurality of gradient pulses along a first gradient axis during the first TR, the first plurality of gradient pulses comprising the first gradient pulses;
apply a second plurality of gradient pulses along a second gradient axis during the first TR, the second plurality of gradient pulses comprising the second gradient pulses.

6. The computer readable storage medium of claim 5 wherein the instructions that cause the computer to split the plurality of echoes cause the computer to split the plurality of echoes of the first echo train via application of a plurality of phaser gradients along the first and second gradient axes.

7. The computer readable storage medium of claim 6 wherein an area of the phaser gradients is one half of an area of the first and second gradient pulses.

8. The computer readable storage medium of claim 3 wherein the instructions further cause the computer to apply a pulse scheme prior to the first TR interval, the pulse scheme configured to cause a violation of a Carr-Purcell-Meiboom-Gill (CPMG) condition.

9. The computer readable storage medium of claim 8 wherein the instructions that cause the computer to apply the pulse scheme cause the computer to apply a plurality of pulses according to a diffusion-weighted preparation scheme.

10. The computer readable storage medium of claim 1 wherein the blade orientation of the second blade is perpendicular to the blade orientation of the first blade.

11. A method comprising:
generating an echo train via application of a radio frequency (RF) pulse train during each repetition time (TR) interval of a pulse sequence;
splitting echoes of the echo train into multiple echo pairs, each echo pair comprising a first echo followed by a second echo and occurring during a respective echo space of the RF pulse train;
for each respective echo space:
applying a plurality of gradient pulses toward an imaging object;
during the first echo of the echo pair corresponding to the respective echo space, acquiring magnetic resonance (MR) data for a first k-space blade from the first echo during application of a first pulse of the plurality of gradient pulses; and
during the second echo of the echo pair corresponding to the respective echo space, acquiring MR data for a second k-space blade from the second echo during application of a second pulse of the plurality of gradient pulses, wherein the first and second blades are non-parallel and correspond to a single k-space;
reconstructing the acquired MR data into an image; and
displaying the image to a user.

12. The method of claim 11 wherein the first and second blades are orthogonal.

13. The method of claim 11 wherein splitting comprises:
applying a first phaser gradient along a first gradient axis; and
applying a second phaser gradient along a second gradient axis simultaneously with the first phaser gradient, wherein the second gradient axis is perpendicular to the first gradient axis.

14. The method of claim 13 wherein applying the first and second phaser gradients comprises:
applying the first phaser gradient such that an area thereof is half of an area of the first pulse of the plurality of gradient pulses; and
applying the second phaser gradient such that an area thereof is half of an area of the second pulse of the plurality of gradient pulses.

15. The method of claim 11 further comprising:
applying a first RF pulse of the RF pulse train; and
executing a spin preparation sequence configured to cause a violation of a Carr-Purcell-Meiboom-Gill (CPMG) condition.

16. The method of claim 11 further comprising positioning the imaging object in a bore of an MR system magnet such that a CPMG condition is violated due to eddy current, field inhomogeneity, and susceptibility.

17. The method of claim 11 further comprising rotating acquisition of the first and second k-space blades for each TR interval such that each acquired k-space blade comprises a distinct angular orientation.

18. An MRI apparatus comprising:
a magnetic resonance imaging (MRI) system having a plurality of gradient coils positioned about a bore of a magnet to impress a polarizing magnetic field and an radio frequency (RF) transceiver system and an RF switch controlled by a pulse module to transmit RF signals to an RF coil assembly to acquire MR images; and
a computer programmed to:
apply pulses of a pulse sequence toward an imaging object, wherein the pulse sequence comprises a plurality of echo spaces, and wherein the pulses comprise:
a plurality of RF pulses corresponding to the plurality of echo spaces;
a plurality of phaser gradient pulses corresponding to each echo space of the plurality of echo spaces and configured cause a pair of echoes to be generated during each echo space, wherein each pair of echoes comprises a first echo followed by a second echo;
a plurality of readout gradient pulses corresponding to each echo space of the plurality of echo spaces;
acquire k-space data for a first k-space blade during application of a first readout gradient pulse of the plurality of readout gradient pulses in a first echo space and during the first echo of the first echo space;
acquire k-space data for a second k-space blade during application of a second readout gradient pulse of the plurality of readout gradient pulses in the first echo space and during the second echo of the first echo space, wherein the second k-space blade is orthogonal to the first k-space blade, and wherein the first and second k-space blades correspond to a single k-space; reconstruct acquired k-space data for the first and second k-space blades into an image.

19. The MRI apparatus of claim 18 wherein each phaser gradient pulse of the plurality of phaser gradient pulses has an area corresponding to one half of an area of each readout gradient pulse of the plurality readout of gradient pulses.

20. The MRI apparatus of claim 18 wherein the pulses further comprise a plurality of pulses according to a diffusion-weighted preparation scheme configured to cause a violation of a Carr-Purcell-Meiboom-Gill (CPMG) condition.

* * * * *